US012620685B2

(12) United States Patent
Campion et al.

(10) Patent No.: US 12,620,685 B2
(45) Date of Patent: May 5, 2026

(54) VARIABLE LENGTH VERTICALLY STACKED NESTED WAVEGUIDE DEVICE

(71) Applicant: TERASI AB, Värmdö (SE)

(72) Inventors: James Campion, Värmdö (SE); Bernhard Beuerle, Solna (SE)

(73) Assignee: TERASI AB, Varmdo (SE)

( * ) Notice: Subject to any disclaimer, the term of this patent is extended or adjusted under 35 U.S.C. 154(b) by 258 days.

(21) Appl. No.: 18/550,747

(22) PCT Filed: Mar. 15, 2022

(86) PCT No.: PCT/EP2022/056661
§ 371 (c)(1),
(2) Date: Sep. 15, 2023

(87) PCT Pub. No.: WO2022/194847
PCT Pub. Date: Sep. 22, 2022

(65) Prior Publication Data
US 2024/0113408 A1      Apr. 4, 2024

(30) Foreign Application Priority Data

Mar. 15, 2021      (SE) .................................... 2130071-0

(51) Int. Cl.
H01P 3/12 (2006.01)
G01R 35/00 (2006.01)
(52) U.S. Cl.
CPC .............. H01P 3/12 (2013.01); G01R 35/005 (2013.01)
(58) Field of Classification Search
CPC ............ H01P 3/12; G01R 35/005; G01R 1/24

USPC ........ 333/239, 242, 157, 208; 324/601, 750, 324/754
See application file for complete search history.

(56) References Cited

U.S. PATENT DOCUMENTS

| | | | |
|---|---|---|---|
| 2,522,279 | A | 9/1950 | Koller et al. |
| 2008/0303613 | A1 | 12/2008 | Lau et al. |
| 2013/0342288 | A1 | 12/2013 | Lau |

FOREIGN PATENT DOCUMENTS

| | | |
|---|---|---|
| CN | 107942276 A | 4/2018 |
| CN | 110112522 A | 8/2019 |
| GB | 2497982 A | 7/2013 |
| WO | WO 2016/163932 A1 | 10/2016 |

(Continued)

OTHER PUBLICATIONS

Dhillon et al., The 2017 terahertz science and technology roadmap 2017 J. Phys. D: Appl. Phys. (Year: 2017).*

(Continued)

*Primary Examiner* — Andrea Lindgren Baltzell
*Assistant Examiner* — Victor Cole
(74) *Attorney, Agent, or Firm* — Harness, Dickey & Pierce, P.L.C.

(57) ABSTRACT

The present invention relates to a variable length vertically stacked nested waveguide device, comprising a series of, N, waveguide components. Each waveguide component comprises a waveguide layer comprising a waveguide opening, a recess layer comprising a recess, a conductive material coating. The waveguide components are nested within each other to create a nested structure with a combined waveguide opening length defined by the total length of the wave-guide openings in each waveguide components.

9 Claims, 6 Drawing Sheets

(56)  References Cited

FOREIGN PATENT DOCUMENTS

WO    WO 2017/192071 A1    11/2017

OTHER PUBLICATIONS

International Patent Application No. PCT/EP2022/056661; Int'l Search Report and Written Opinion; dated Jun. 29, 2022; 16 pages.

Stanec et al.; "Integrating micromachined circuits to submillimeter systems"; $40^{th}$ European Microwave Conf.; 2010; p. 53-56.

Campion et al.; "Silicon-Micromachined Waveguide Calibration Shims for Terahertz Frequencies"; ieee Mtt-S Int'l Microwave Symposium; 2019; p. 1265-1268.

Lewandowski et al.; "Calibration of a 220-325 GHz vector-network-analyzer with multiple rectangular-waveguide sections"; $18^{th}$ Int'l Conf. on Microwaves, Radar and Wireless Communications; 2010; 4 pages.

Rahiminejad et al.; "Polymer Gap Adapter for Contactless, Robust, and Fast Measurements at 220-325 GHz"; Journal of Microelectromechanical Systems; vol. 25 No. 1 Feb. 2016; p. 160-169.

* cited by examiner

Filled 2-port
waveguide

Filled 1-port
waveguide

VARIABLE LENGTH VERTICALLY STACKED NESTED WAVEGUIDE DEVICE

FIELD OF THE INVENTION

The present invention relates to a variable length vertically stacked nested waveguide device, comprising a series of, N, waveguide components. Each waveguide component comprises a waveguide layer comprising a waveguide opening, a recess layer comprising a recess, a conductive material coating. The waveguide components are nested within each other to create a nested structure with a combined waveguide opening length defined by the total length of the wave-guide openings in each waveguide components.

BACKGROUND OF THE INVENTION

Waveguides are available today in a variety of materials, form factors and performance levels, with hollow metallic waveguides being the most prevalent due to their compatibility with industrial machining processes such as CNC milling. At frequencies above 100 GHz the tolerances associated with such manufacturing processes greatly degrade the mechanical precision and electrical performance of waveguides. In one embodiment, waveguides can be formed as through-going apertures in a substrate material. The accuracy in the length of such waveguides is limited by the precision of the substrate material's thickness. At frequencies above 100 GHz, manufacturing tolerances limit the precision that can be achieved in such through-going waveguides, particularly for devices of short electrical length. Devices of different length can be realised if multiple substrates of suitable thickness are available but are each then limited by the thickness tolerance of their relevant substrate.

Hence, an improved method for realising precision waveguides of various lengths would be advantageous, and in particular a more efficient and/or reliable method for combining multiple waveguides to realise a desired overall length while ensuring accurate alignment between the waveguide apertures would be advantageous.

OBJECT OF THE INVENTION

It is a further object of the present invention to provide an alternative to the prior art.

In particular, it may be seen as an object of the present invention to provide a waveguide device that solves the above mentioned problems of the prior art.

SUMMARY OF THE INVENTION

Thus, the above described object and several other objects are intended to be obtained in a first aspect of the invention by providing variable length vertically stacked nested waveguide device. Such a device typically comprises a series of, N, waveguide components, where N being two or greater. The number of waveguide components is typically selected in accordance with a specific requirement for a length of waveguide opening as each waveguide component comprises a waveguide layer comprising a waveguide opening, a recess layer comprising a recess, a conductive material coating.

It is noted that although the term "layer" is used in this connection, this does not necessarily indicates that the waveguide component is provided as separate elements pieced together as one or more, such as all waveguide component may be provided by producing the waveguide component from a single element.

The waveguide device preferably also comprises a waveguide flange interface comprising a waveguide opening.

The waveguide components are typically nested within each other to create a nested structure with a combined waveguide opening length defined by the total length of the wave-guide openings in each waveguide components and the waveguide opening in the waveguide flange interface. This is accomplished by aligning the individual waveguide openings of the waveguide components by the nested structure.

By such a waveguide device, a high precision and changeable combined waveguide opening can be provided, as the length of the combined waveguide opening is determined by the number of waveguide components and the waveguide flange interface.

The precision is typically controlled by the precision by which the waveguide openings is produced and by the precision by which the geometries providing the nesting of the waveguide components and waveguide flange interface are produced. It may be preferred that the geometries are provided so that the nesting is provided by a snug fit.

It is further more preferred that the dimensions of waveguide openings in the nested structure are essentially identical to each other, but in some embodiments, it may be preferred to have waveguide openings with dimensions being different to each other, although, preferably, still forming a combined wave guide opening. Preferably, the waveguide openings are rectangular, but other shapes may be used in connection with the present invention.

In some preferred embodiments, the individual waveguide openings may be of different sizes, either to provide completely discontinuous structures or tapered structures. Discontinuous openings may be used inter alia as filters/ frequency selective devices. Tapers can be used for impedance transformations or antennas.

In some preferred embodiments of a device according to the invention, the device is configured to act as a frequency selective element, by two or more layers being designed with waveguide opening dimensions such that the device serves to act as a frequency selective element. Preferably, the dimensions of the opening and thickness of the layer(s) may be chosen such that the waveguide opening acts as a resonator whose resonance frequency is determined by these parameters. Several resonators may be formed in two or more layers and combined to create a filtering device whose frequency response is dependent on the resonant frequencies of its constitutive resonators and their interconnection.

In some preferred embodiments of a device according to the invention, the device is configured to act as an impedance matching elements, by two or more layers being designed with waveguide opening dimensions such that the device acts as an impedance matching element. Preferably, the dimensions of the openings may be chosen such that the impedance of each waveguide opening is some fraction or multiple of the impedance of the preceding layer. This impedance is, typically, defined by the cross-sectional dimensions of each opening. One or more such openings can be used to implement an impedance tapering device by gradually increasing/decreasing the cross-sectional dimensions of each layer. Alternatively, the opening(s) may be designed to transform the impedance of a structure to which it is connected, depending on the dimensions and thicknesses of the opening(s).

In some preferred embodiments of a device according to the invention, the device is configured to act as an antenna element by two or more layers being designed with waveguide openings such that the element acts as an antenna element. Preferably, the dimensions of the openings may be chosen such that the device acts as an antenna structure, which provides an impedance transformation between the input and output ports of the device and the space into which the electromagnetic energy is to be radiated. The antenna may serve to provide an effective transmission of electromagnetic energy into this space. The radiation efficiency, gain, bandwidth and impedance of the antenna device are, typically, dependent on the shape, dimensions and thickness of the waveguide opening(s).

In a second aspect, the invention relates to a terahertz waveguide vector network analyzer calibration kit. Such a kit may preferably comprise two or more calibration devices of either a waveguide device according to the first aspect not including a backshort, and/or a waveguide device according to the first aspect and comprising backshort, and/or waveguide device according to the first aspect and comprising a filling material filled within the length of the waveguide opening.

In a third aspect, the invention relates to a method for calibrating a system using the waveguide device (1) according to the first aspect and the calibration kit according to the second aspect. Such method of calibrating a system may comprise measuring the reflectance and/or transmittance of a a flush short calibration device, which provides a reference reflective standard for a waveguide test apparatus a waveguide device according to first aspect which provides a reference transmissive standard for a waveguide test apparatus and/or a waveguide device with accompanying backshort, which provides a reference reflective standard for a waveguide test apparatus and/or a waveguide device according the first aspect and comprising a filling material filled within the length of the waveguide opening to provide a reference transmissive standard for a waveguide test apparatus.

The first, second and third aspect of the present invention may each be combined with any other aspects. These and other aspect of the invention will be apparent from and elucidated with reference to the embodiments described hereinafter.

BRIEF DESCRIPTION OF THE FIGURES

The present invention and in particular preferred embodiments thereof will now be described in more detail with regard to the accompanying figures. The figures show ways of implementing the present invention and are not to be construed as being limiting to other possible embodiments falling within the scope of the attached claim set.

FIG. 1 further illustrates that a backshort may be incorporated in the nested waveguide components to make the waveguide a 1-port waveguide;

DETAILED DESCRIPTION OF AN EMBODIMENT

Figure 1:
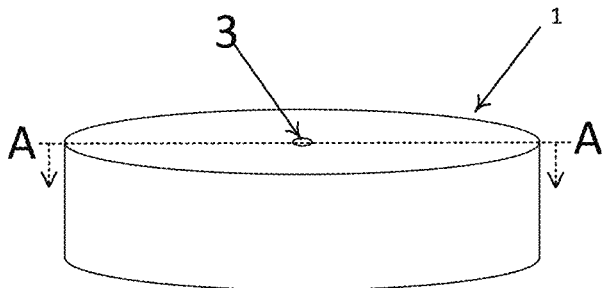
FIG. 1 schematically illustrates in cross sectional views a first preferred embodiment of waveguide components; the left hand side of FIG. 1 illustrates the waveguide components in an exploded view whereas the right hand side of FIG. 1 illustrates the waveguide components in a nested configuration.
Figure 1:
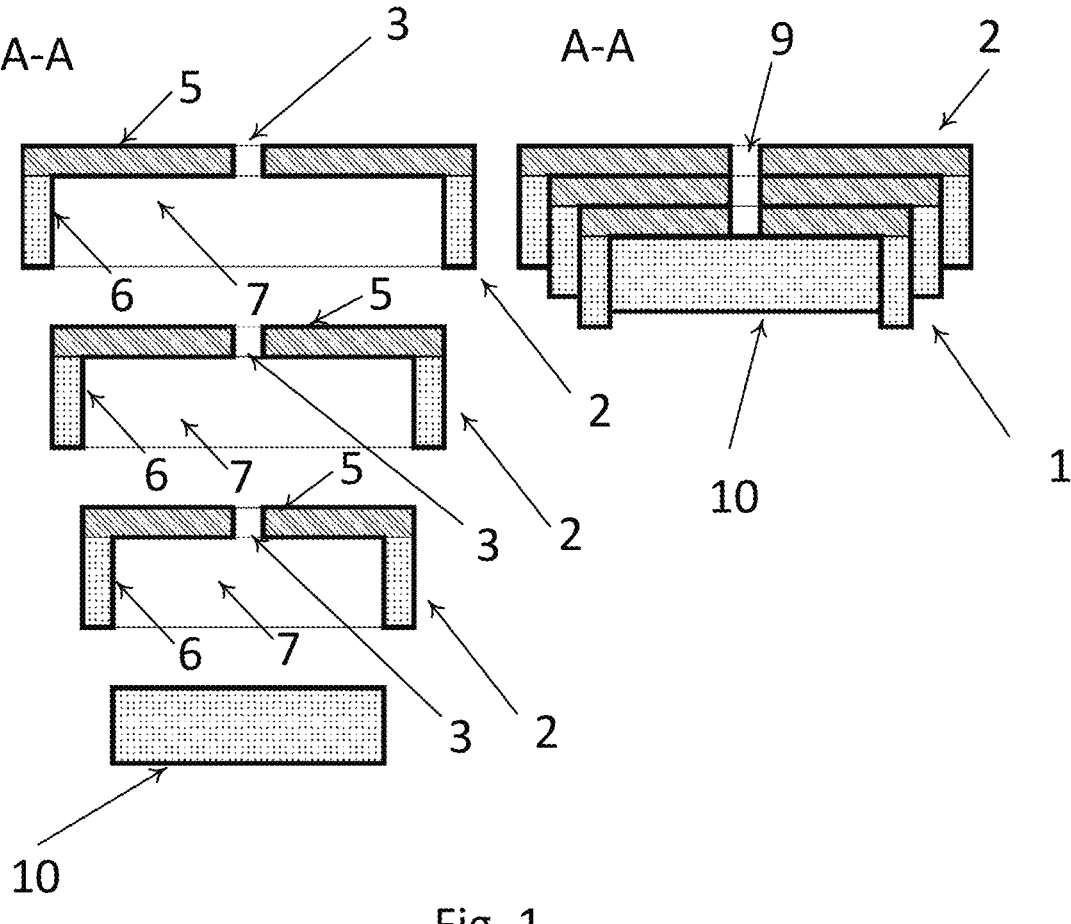
Figure 2:
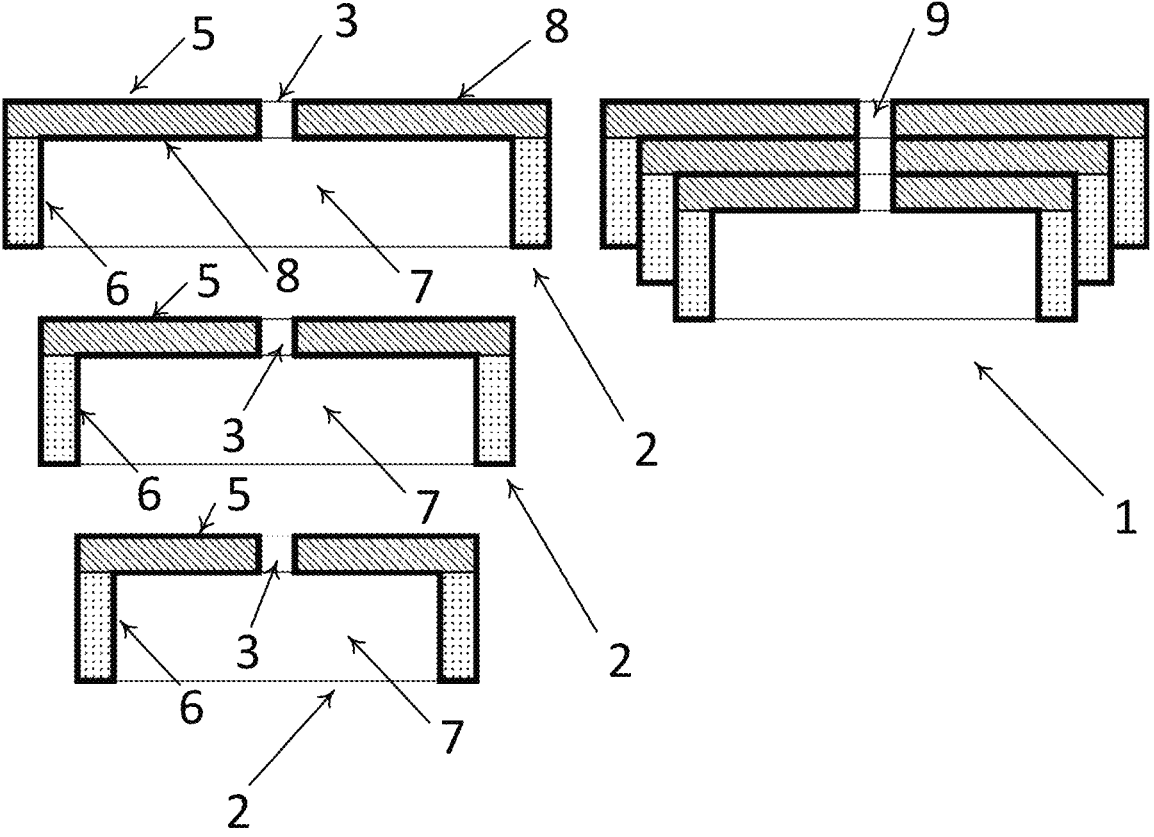
FIG. 2 schematically illustrates in cross sectional views a second preferred embodiment. This second preferred embodiment is different from the embodiment of FIG. 1 as the backshort is not present and the waveguide is a 2-port waveguide.

Reference is made to FIGS. 1 and 2 illustrating a cross sectional view of a vertically stacked nested waveguide device 1 according to one embodiment of the invention. In FIG. 1 the wave-guide device 1 is illustrated in a separated state in the left hand side view and in a nested configuration in the right hand side view. Further, the embodiment of FIG. 1 further illustrates an optional back short 10. Kindly observe that FIG. 1 also indicates in the uppermost part of FIG. 1, the waveguide device 1 as viewed from the outside and where the cross section is made ("A-A"). This information is omitted to avoid lengthy repetitions in FIGS. 2, 3, 4, 8 and 9.

The vertically stacked nested waveguide device 1 comprises a series, N, waveguide components 2. The number N is preferably two or greater, such that waveguide device 1 is a vertical stack of a plurality of components. The example shown in FIG. 2, is when N is equal to three, such that the vertically stacked nested waveguide device 1 illustrated in FIG. 2 comprises three waveguide components, but other values of N is also possible, such as N equal to two, four or even five or six. In some cases N may even be equal to a number between seven and twenty.

Preferably, but not limited to, the waveguide components 2 are made from a semiconductor material, such as a wafer, Each waveguide component 2 has a waveguide opening 3 and a thickness, and the outer dimension of each subsequent waveguide component in a series is decreasing. Each waveguide component 2 further comprises a waveguide layer 5 in which the waveguide opening 3 is provided. The waveguide opening 3 is a through-going opening. Each waveguide component 2 has a recess layer 6 defining an internal recess 7 and a conductive material coating 8, such as gold, copper or silver. Kindly observe, that in FIG. 2 the conductive material coating 8 is only pointed at in the upper most waveguide component to avoid rendering the figure unclear; the conductive material coating 8 is provided on all the waveguide components shown and is illustrated by a line having a substantial thickness.

As shown in FIGS. 1 and 2, a waveguide component 2 is configured to receive in its recess 7 a next waveguide component 2 in the stack. This is preferably provided by the geometry of a recess 7 of a receiving waveguide component 2 is shaped so as to mate outer geometry of a waveguide component 2 to be received. Further, the waveguide openings of the receiving waveguide component 2 and the received waveguide components are arranged in the waveguide components 2 such the waveguide openings 3 are aligned to form an essentially continuously waveguide opening 9.

In some embodiments, the waveguide openings 3 are aligned but may not form an essentially continuously waveguide opening 9, such as a discontinuous waveguide opening 9. A discontinuous waveguide opening 9 may be provided, when at least some of waveguide openings 3 have dimensions being different to each other.

Figure 5:
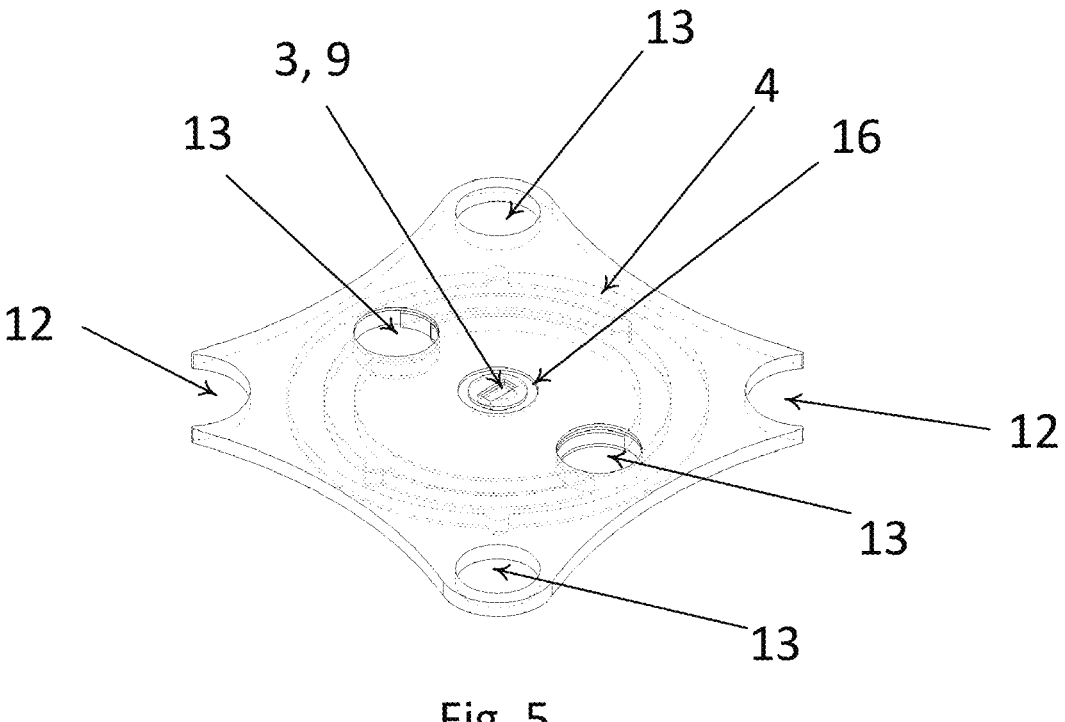
FIG. 5 illustrates in a front perspective view, an embodiment of a waveguide flange interface; the embodiment shown in FIG. 5 also illustrates an optional RF choke.
Figure 6:
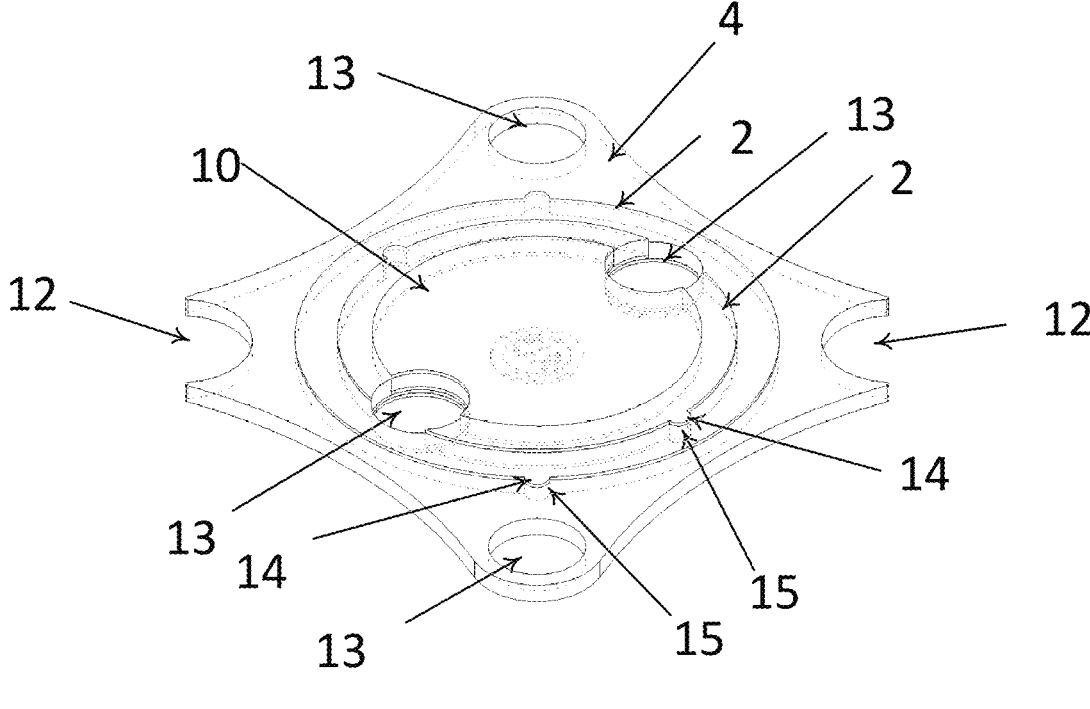
FIG. 6 illustrates in rear perspective view, an embodiment of a variable length vertically nested waveguide device.
Figure 7:
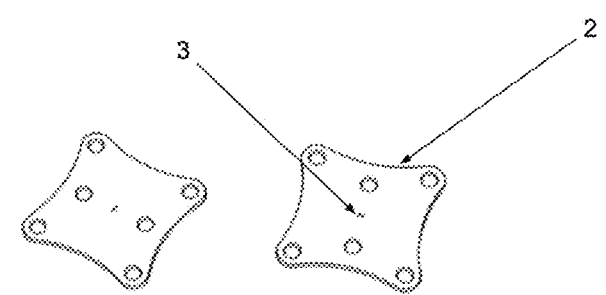
FIG. 7 is a photograph depicting different waveguide flange interfaces in front and rear views.
Figure 7:
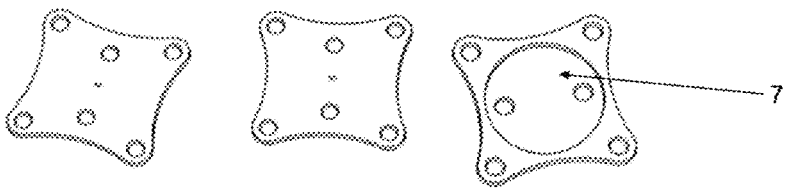
Figure 8:
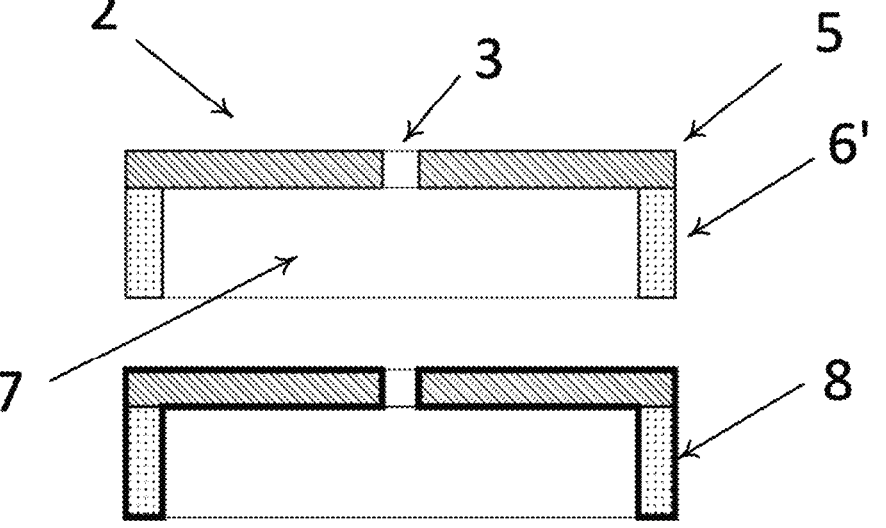
FIG. 8 schematically illustrates in a cross sectional view a waveguide component without (upper part) and with (lower part) a conductive coating.

The vertically stacked nested waveguide device 1 may further comprises a waveguide flange interface 4. Such a waveguide flange interface 4 is shown in FIGS. 5 and 6. In FIG. 5 the waveguide flange interface 4 is shown in front view and in FIG. 6 the waveguide flange interface 4 is shown in rear view (kindly note that the front and rear may be reversed). In FIG. 6 two waveguide components 2 and a backshort 10 are nested arranged in the flange interface 4. The waveguide flange interface 4 which forms part of the waveguide device 1 (being the top component in the stack) is, besides providing a section of the combined waveguide opening 9, typically used to assemble the waveguide device 1 and to provided rigidity to the waveguide device 1 while at the same time provides a connection to a flange of the device in which the waveguide device 1 is to be used. The flange interface 4 may also serve the purpose of allowing the device to be connected to/in a flange or package which provide further rigidity (e.g. the waveguide device 1 may be packed in a metal holder)

The waveguide flange interface 4 comprises as illustrated in FIGS. 5 and 6 a waveguide opening 3. This waveguide opening 3 forms part of the combined wave guide opening 9. Thus, the waveguide flange interface 4 forms part of the vertically stacked nested waveguide device 1.

It is noted that "layers" as used in waveguide layer 5 and recess layer 7 does not necessarily implies that the two are separate elements connected to each other, although the terminology is adapted from the following description pertaining to a preferred way of fabrication.

Figure 4:
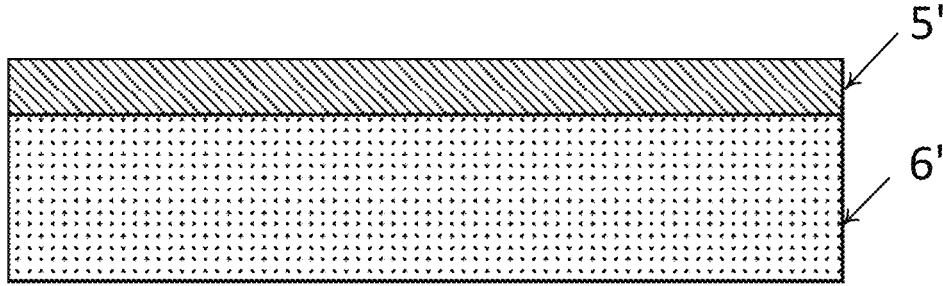
FIG. 4 schematically illustrates a cross sectional view of a semiconductor material comprising a waveguide layer and a recess layer; the semiconductor illustrated is the blank material from which a waveguide component is produced.

With reference to FIG. 4 illustrating a cross sectional view of a semiconductor material comprising a waveguide layer 5 and a recess layer 6. Although FIG. 4 shows a semiconductor, other materials such as metal material(s), plastic material(s), glass, epoxy laminates, such as printed circuit board materials or even combinations thereof are applicable in connection with the present invention. The waveguide component 2 can be fabricated by using a silicon on insulator (SOI) wafer comprising of two layers of silicon, a device and a handle layer, with a silicon dioxide layer in between. An embodiment of such a starting element comprising a device layer (referenced with numeral 5') and a handle layer (referenced by numeral 6') is illustrated in FIG. 4. The device layer with thickness corresponds to the waveguide layer 5 and the handle layer to the recess layer 6. The waveguide opening 3 is preferably etched into the waveguide layer 5 and the recess 7 into the recess layer 6 is preferably provided by use of deep reactive ion etching (DRIE). In some embodiments, the waveguide layer 5 corresponds to the handle layer and the recess layer 6 to the device layer of the SOI wafer.

Thus, in preferred embodiments, the waveguide components of the vertically stacked nested waveguide device 1 are nested within each other to create a nested structure comprising a continuous waveguide or a discontinuous waveguide. By discontinuous is preferably meant that the dimensions of wave guide openings are different from each other, or at least that some of the wave guide openings are different from each other. The length of the waveguide can be varied by the number of waveguide components applied. In some embodiments, the continuous waveguide or discontinuous waveguide is used as a calibration standard, having a combined waveguide opening 9 length by aligning the individual wave guide openings 3 of the each waveguide component 2 and the nested structure are placed within the waveguide flange interface 4.

The outer dimension of each waveguide component is determined according to a predefined size equal to the inner dimension of the recess 7 in the previous waveguide component 2. As one measure of the invention is to provide a waveguide opening with a predefined length, each waveguide component 2 is nested within and assembled together.

The variable length vertically stacked nested waveguide device 1, is in one embodiment further comprising the step of choosing the number N according to the length of the predefined waveguide opening 3, such as the total outer dimension of chosen number of N is matching to a predefined waveguide opening 3 length. By this, the waveguide device 1 may serve the purpose of a calibration standard.

The variable length vertically stacked nested waveguide device 1, for example, may include that the outer dimension of an i+1 waveguide component 2, i going from 1 . . . . N–1, in the series, matches the inner dimension of the recessed section of the $i^{th}$ waveguide component 2 to create self-alignment of the waveguide components in the series.

Is it noted that "inner dimension" and "outer dimension" preferably refers to the dimensions related to the surfaces abutting each other when a waveguide component 2 is arranged in a recess 7.

In some preferred embodiments, the variable length vertically stacked nested waveguide device 1 comprises alignment holes 13 for the insertion of alignment pins. Such alignment holes 13 are shown in FIGS. 5 and 6. The alignment holes 13 are used to align the waveguide device 1 in an apparatus in which the waveguide is to be used. In particular, the alignment holes are used to gain accurate measurements by aligning the waveguide opening 3 to a testport of a waveguide test device by pushing alignment pins of the waveguide test device through the alignment holes 13 on the variable length vertically stacked nested waveguide device 1 alignment, when attaching the variable length vertically stacked nested waveguide device 1 to the waveguide test device. It is preferred that at least two alignment holes 13 are provided but in other embodiments, it may be preferably to have three alignment holes, such as four, five, six or even eight alignment holes 13. In general, there may not be a fixed number of alignment holes as the number may be selected in accordance with specific desires or needs.

In some embodiments, the variable length vertically stacked nested waveguide device 1 has the alignment holes 13 manufactured into the flange interface 4. This dimension of the alignment holes 13 is provided such as to fit with alignment pins of an apparatus in which the waveguide device 1 is to be used. The alignment pins may be longer than the entire stack, so that each waveguide components could also contain holes to accept the pins located in both the waveguide components 2 and the waveguide flange interface 4.

In a further embodiment, the variable length vertically stacked nested waveguide device 1 further comprises mating protrusions 14 and intrusions 15 for the interlocking of the waveguide components 2 with other waveguide components 2 and/or with the waveguide flange interface 4, such that both the alignment holes 13 and the waveguide opening 3 is kept in place and aligned with each other. One such example is illustrated in FIG. 6.

In some preferred embodiments, waveguide components 2 each been manufactured to have a precision on the dimension of less than 1 µm, such as less than 0.5 µm, more preferably less than 0.3 µm.

In some preferred embodiments, the variable length vertically stacked nested waveguide device 1 further comprising an integrated RF choke 16. Such an RF choke 16 is illustrated in FIG. 5 as being implemented in the waveguide flange interface 4. However, an RF choke can be implemented in any of the waveguide components 2 or in the waveguide flange interface 4 having a correct thickness such as a thickness of n*λ/i, i being an integer, such as a layer of thickness λ/4. The RF choke 16 is designed to prevent electromagnetic leakage in case of the presence of a small gap when connecting the waveguide flange interface 4 to an an apparatus in which the waveguide device 1 is to be used. As illustrated in FIG. 5, the RF choke 16 is formed as a circular recess having a width and a depth in the surface encircling the waveguide opening 4, but other shapes such as elliptical or square may be used. The dimensions of the RF choke 16 (e.g. width and depth) should preferably be matched to the frequency of operation, such as having an electrical length of λ/2 from the waveguide opening 4.

In some preferred embodiments, the waveguide opening in each waveguide component 2 creates a phase offset of an incoming wave of n+λ/i, i,n being an integer, such as λ/4.

The outer shape of the flange interface 4 may preferably has a shape comprising semi-circular recesses 12 (see FIG. 5) or any other shape which is designed to ease (man) handling of the waveguide 1 during insertion into a holder of an apparatus as disclosed above. These recesses 12 are also found to be useful during the process of aligning pins with alignment holes as disclosed above.

As presented herein, the waveguide device 1 may in preferred embodiment include a backshort 10. Such a backshort 10 is typically adapted to fit within the last waveguide component 2 in the nested stack. By last waveguide component is meant the last waveguide component 2 of the stack having an open recess 7. The backshort 10 is used to close the combined waveguide opening 9.

Figure 3:
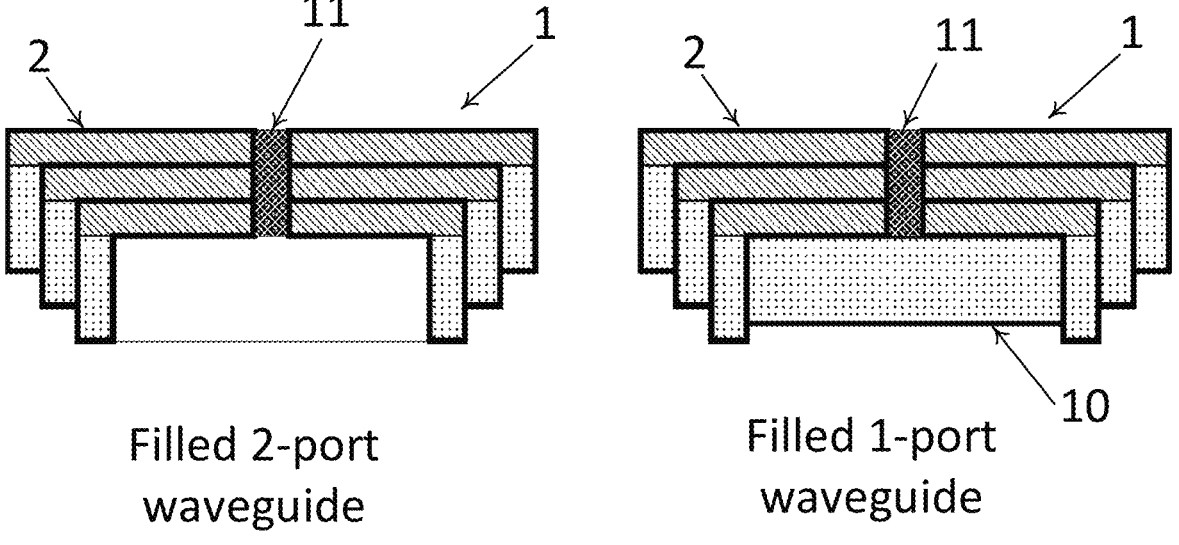
FIG. 3 schematically illustrates in cross sectional views two other embodiments, where the embodiment in the left hand side is a 2-port waveguide wherein the waveguide openings have been filled with a material. The embodiment in the right hand side is a 1-port waveguide where the waveguide openings have been filed with a material.

With reference to FIG. 3, showing a cross sectional view of a variable length vertically stacked nested waveguide device 2 further comprising a waveguide filling material 11, such as an electromagnetic absorbing material, filled within the length of the combined waveguide opening 9 to create a waveguide load, such as a load standard. The waveguide load is used to prevent unwanted signal reflections in a waveguide system or during calibration of a waveguide test instrument.

The filling material 11 is typically arranged in the combined waveguide opening 9 after the waveguide components 2 have been stacked and is typically to the full length of the combined waveguide length 9.

Figure 9:
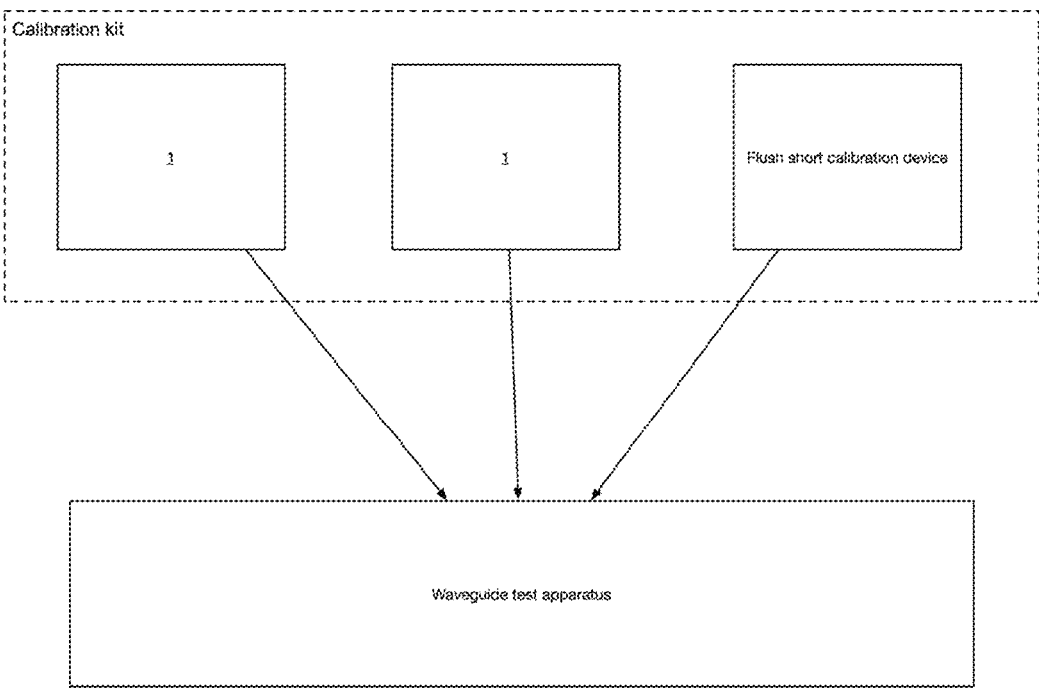
FIG. 9 shows a schematic view of a calibration kit, a plurality of waveguide devices, a flush short calibration device, and a waveguide test apparatus.

Reference is made to FIG. 9 illustrating a schematic view of a terahertz waveguide vector network analyzer calibration kit according to one embodiment of the invention. In FIG. 9, the terahertz waveguide vector network analyzer calibration kit is illustrated as including two or more calibration devices including the variable length vertically stacked nested waveguide devices 1.

Figure 10:
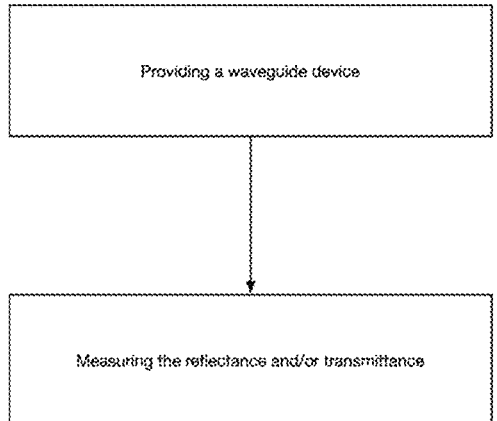
FIG. 10 shows a schematic view of a method for calibrating a system with a step of providing a waveguide device and a step of measuring the reflectance and/or transmittance.

Reference is made to FIG. 10 illustrating a schematic view of a method for calibrating a system, the method including providing a waveguide device and measuring at least one of the reflectance and/or transmittance of the device.

The waveguide filling material 11 may be but not limited to an electromagnetic absorbing material realised from a semiconductor substrate, resin filled with absorbing particles or an absorbing liquid. Alternatively, the filling material can be used to alter the phase offset incurred by signals propagating through the waveguide 3.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

LIST OF REFERENCE SYMBOLS USED

1 A variable length vertically stacked nested waveguide device
2 Waveguide component
3 Waveguide opening
4 Waveguide flange interface
5 Waveguide layer
6 Recess layer
7 Recess
8 Conductive material coating
9 Combined waveguide opening length
10 Backshort
11 Waveguide filling material
12 Semi-circular recess
13 Alignment hole
14 Protrusion
15 Intrusion
16 RF choke

The invention claimed is:

1. A variable length vertically stacked nested waveguide device, comprising:
  a series of N waveguide components, N being two or greater, each waveguide component including
    a waveguide layer including a waveguide opening,
    a recess layer including a recess, and
    a conductive material coating; and
  a waveguide flange interface including a waveguide opening, wherein
    the N waveguide components are nested within each other to create a nested structure with a combined waveguide opening length defined by a total length of a waveguide opening in each waveguide component and the waveguide opening in the waveguide flange interface by aligning individual waveguide openings of the N waveguide components, the nested structure is placed within the waveguide flange interface so that waveguide openings of the N waveguide components are aligned with the waveguide opening in the waveguide flange interface, and the waveguide opening in each waveguide component creates a phase offset of an incoming of $n*\lambda/i$, i, n being an integer.

2. The variable length vertically stacked nested waveguide device according to claim 1, wherein an outer dimension of an (i+1)th waveguide component, i going from 1 to N−1, in the series of N waveguide components is an inner dimension of a recessed section of an $i^{th}$ waveguide component to create self-alignment of the N waveguide components in the series of N waveguide components.

3. The variable length vertically stacked nested waveguide device according to claim 1, further comprising:
alignment holes for inserting alignment pins.

4. The variable length vertically stacked nested waveguide device according to claim 3, wherein the alignment holes are manufactured into said waveguide flange interface.

5. The variable length vertically stacked nested waveguide device according to claim 1, further comprising:
mating protrusions and intrusions for interlocking the N waveguide components and the waveguide flange interface.

6. A terahertz waveguide vector network analyzer calibration kit, comprising:
two or more calibration devices including the variable length vertically stacked nested waveguide device according to claim 1.

7. The variable length vertically stacked nested waveguide device according to claim 1, further comprising:
a backshort configured to fit within a last waveguide component of the nested structure to close the combined waveguide opening length or the waveguide opening.

8. A variable length vertically stacked nested waveguide device, comprising:
a series of N waveguide components, N being two or greater, each waveguide component including
a waveguide layer including a waveguide opening,
a recess layer including a recess, and
a conductive material coating;
a waveguide flange interface including a waveguide opening, wherein
the N waveguide components are nested within each other to create a nested structure with a combined waveguide opening length defined by a total length of a waveguide opening in each waveguide component and the waveguide opening in the waveguide flange interface by aligning individual waveguide openings of the N waveguide components, and the nested structure is placed within the waveguide flange interface so that the waveguide openings of the N waveguide components are aligned with the waveguide opening in the waveguide flange interface; and a waveguide filling material filled within the waveguide opening length to create a waveguide load, attenuator, or phase shifter.

9. A method for calibrating a system, the method comprising:
providing a waveguide device and a calibration kit including
a series of N waveguide components, N being two or greater, each waveguide component including
a waveguide layer including a waveguide opening,
a recess layer including a recess, and
a conductive material coating;
a waveguide flange interface including a waveguide opening, wherein
the N waveguide components are nested within each other to create a nested structure with a combined waveguide opening length defined by a total length of a waveguide opening in each waveguide component and the waveguide opening in the waveguide flange interface by aligning individual waveguide openings of the N waveguide components,
the nested structure is placed within the waveguide flange interface so that the waveguide openings of the N waveguide components are aligned with the waveguide openings in the waveguide flange interface, and
the waveguide opening in each waveguide components creates a phase offset of an incoming wave of $n*\lambda/i$, i, n being an integer, and
measuring at least one of a reflectance or a transmittance of one or more of
a flush short calibration device, for providing a reference reflective standard for a waveguide test apparatus,
a waveguide device for providing a reference transmissive standard for a waveguide test apparatus,
a waveguide device with a backshort configured to fit within a last waveguide component of the nested structure to close the combined waveguide opening length or the waveguide opening, for providing a reference reflective standard for a waveguide test apparatus, or
a waveguide device with a waveguide filling material filled within a waveguide opening length to create a waveguide load, attenuator, or phase shifter, for providing a reference transmissive standard for a waveguide test apparatus.

* * * * *